(12) United States Patent
Estremera

(10) Patent No.: US 11,720,002 B2
(45) Date of Patent: Aug. 8, 2023

(54) CAMERA FOR A MOTOR VEHICLE WITH A SPECIFIC HEAT DISSIPATING DEVICE

(71) Applicant: Connaught Electronics Ltd., Tuam (IE)

(72) Inventor: Joseph Estremera, Tuam (IE)

(73) Assignee: Connaught Electronics Ltd., Tuam (IE)

( * ) Notice: Subject to any disclaimer, the term of this patent is extended or adjusted under 35 U.S.C. 154(b) by 0 days.

(21) Appl. No.: 17/258,593

(22) PCT Filed: Jul. 4, 2019

(86) PCT No.: PCT/EP2019/068001
§ 371 (c)(1),
(2) Date: Jan. 7, 2021

(87) PCT Pub. No.: WO2020/011645
PCT Pub. Date: Jan. 16, 2020

(65) Prior Publication Data
US 2021/0173286 A1    Jun. 10, 2021

(30) Foreign Application Priority Data
Jul. 9, 2018   (DE) ............... 10 2018 116 510.2

(51) Int. Cl.
*H04N 5/76*    (2006.01)
*G03B 17/55*   (2021.01)
(Continued)

(52) U.S. Cl.
CPC .............. *G03B 17/55* (2013.01); *B60R 11/04* (2013.01); *F28D 1/0472* (2013.01); *H04N 23/51* (2023.01);
(Continued)

(58) Field of Classification Search
CPC .. G03B 17/55; H04N 5/22521; H04N 5/2252; H04N 5/2257; H04N 5/2254;
(Continued)

(56) References Cited

U.S. PATENT DOCUMENTS

2005/0276599 A1* 12/2005 Kajino ................. H04N 5/2252
396/419
2009/0250533 A1* 10/2009 Akiyama ................. B60S 1/58
239/284.1
(Continued)

FOREIGN PATENT DOCUMENTS

DE    102012213813 A1    2/2014
DE    102014009561 A1    12/2015
(Continued)

OTHER PUBLICATIONS

International Search Report and Written Opinion in corresponding International Application No. PCT/EP2019/068001, dated Sep. 9, 2020 (9 pages).

(Continued)

*Primary Examiner* — Patrick E Demosky
(74) *Attorney, Agent, or Firm* — Osha Bergman Watanabe & Burton LLP

(57) ABSTRACT

The invention relates to a camera (4) for a motor vehicle (1), with an outer housing (9) and with a heat dissipating device (18) for dissipating heat from the camera (4), wherein the heat dissipating device (18) comprises a duct (19) for conveying a liquid or gaseous heat absorption medium, wherein the duct (19) is arranged at the outer housing (9). The invention also relates to a device (32) and a motor vehicle (1).

10 Claims, 3 Drawing Sheets

Figure 1:
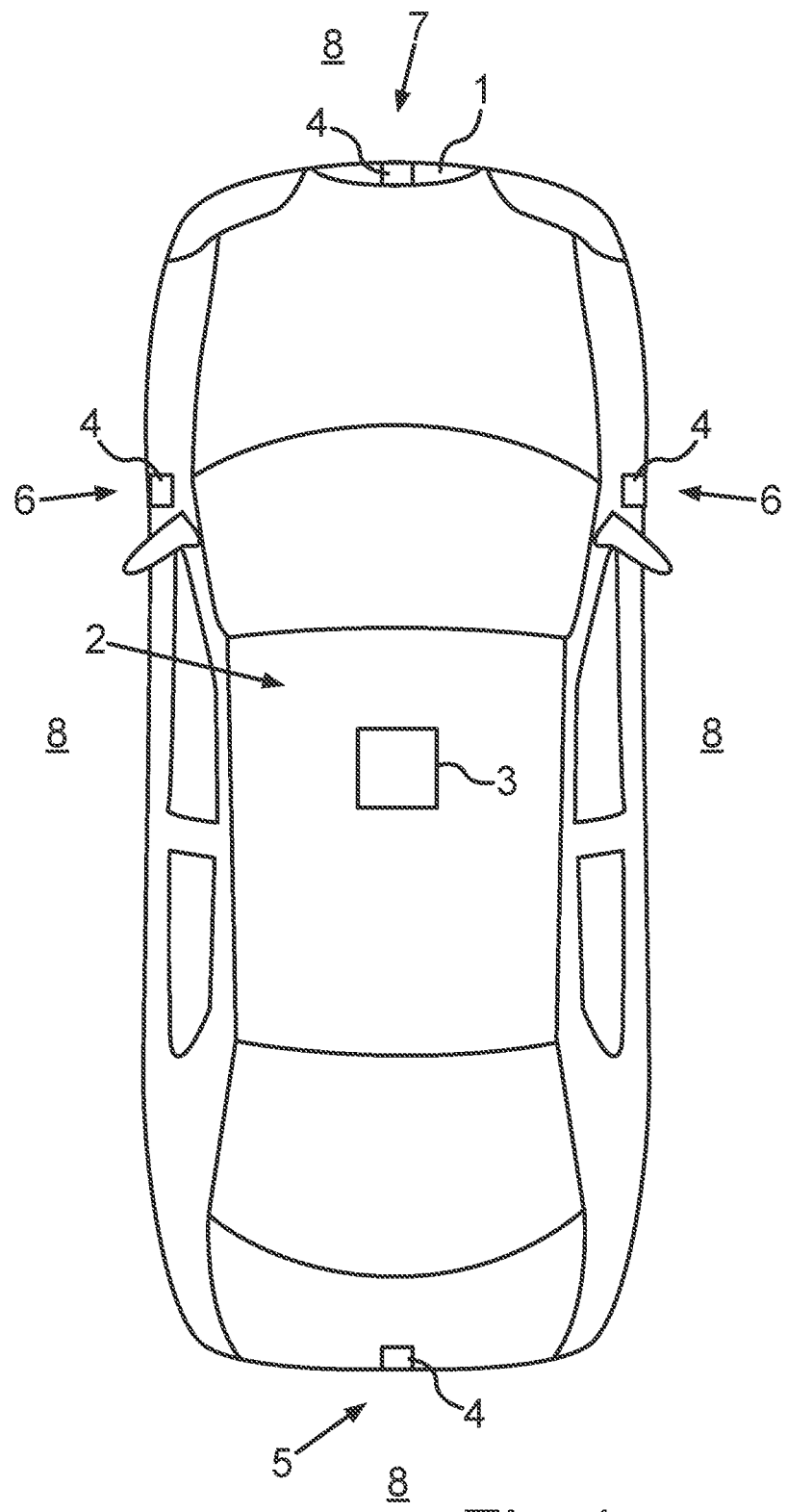

(51) Int. Cl.
*B60R 11/04* (2006.01)
*F28D 1/047* (2006.01)
*H05K 7/20* (2006.01)
*H04N 23/51* (2023.01)
*H04N 23/52* (2023.01)

(52) U.S. Cl.
CPC ......... *H04N 23/52* (2023.01); *H05K 7/20272* (2013.01)

(58) Field of Classification Search
CPC ... B60R 11/04; F28D 1/0472; H05K 7/20272; B60S 1/52
See application file for complete search history.

(56) References Cited

U.S. PATENT DOCUMENTS

| | | | | |
|---|---|---|---|---|
| 2013/0092758 | A1* | 4/2013 | Tanaka | B60S 1/52 239/284.1 |
| 2014/0150990 | A1* | 6/2014 | Huang | F28D 15/0275 165/67 |
| 2015/0296108 | A1* | 10/2015 | Hayakawa | B60S 1/52 348/148 |
| 2016/0272163 | A1* | 9/2016 | Dreiocker | H04N 5/2257 |
| 2017/0064877 | A1* | 3/2017 | Ratcliffe | H04N 5/2252 |
| 2017/0108285 | A1 | 4/2017 | Wang et al. | |
| 2021/0181606 | A1* | 6/2021 | Vitanov | G01K 3/005 |

FOREIGN PATENT DOCUMENTS

| | | | |
|---|---|---|---|
| JP | H08-22069 | A | 1/1996 |
| JP | 2000-032307 | A | 1/2000 |
| JP | 2003-230030 | A | 8/2003 |
| JP | 2003230030 | A * | 8/2003 |
| JP | 2003-533874 | A | 11/2003 |
| JP | 2004-319582 | A | 11/2004 |
| JP | 2009-071053 | A | 4/2009 |
| JP | 4496868 | B2 * | 7/2010 |
| JP | 2012-184913 | A | 9/2012 |
| JP | 2018-072520 | A | 5/2018 |

OTHER PUBLICATIONS

German Search Report in corresponding German Application No. 10 2018 116 510.2, dated Nov. 20, 2018 (6 pages).
Notification of Reason for Rejection issued in Japanese Application No. 2021-500625, dated May 6, 2022 (8 pages).
Notice of Preliminary Rejection issued in corresponding Korean Patent Application No. 10-2021-7000534, dated Mar. 27, 2022 (14 pages).

* cited by examiner

CAMERA FOR A MOTOR VEHICLE WITH A SPECIFIC HEAT DISSIPATING DEVICE

One aspect of the invention relates to a camera for a motor vehicle, with an outer housing and with a heat dissipating device for dissipating heat from the camera.

During operation of a camera heat is generated, in particular by electronic components. To prevent overheating, in particular of components in the outer housing of the camera, the heat has to be dissipated. In this context it is known that a specific heat conductive paste or heat conductive adhesive is arranged in the housing to dissipate heat from the housing. It is also known that on the outer housing a cooling element with cooling fins may be mounted.

Cameras which are arranged in a motor vehicle are known to exist in various designs. In this context it is known that cameras are formed and arranged for capturing the environmental region of the motor vehicle. Moreover, cameras can also be used and arranged for capturing an interior of the motor vehicle. In this context, cameras are exposed to diverse influences which they have to withstand. This is particularly relevant with regard to strong temperature fluctuations and/or other widely varying environmental influences. Moreover, due to vibrations resulting from the movement of the vehicle, cameras are exposed to mechanical stresses which they have to permanently withstand. Under these circumstances it is particularly challenging to enable highly functional operation and to provide sufficiently adequate images which can then be provided to driver assistance systems or used for determining if and, as the case may be, how a driver assistance system functions.

With such extremely compact cameras for a motor vehicle it is known that an outer housing is formed from separate housing parts, an upper housing part and a lower housing part. These housing parts are joined together and in the resulting interior form a receiving space for further components, in particular a lens module and at least one circuit board.

Cameras for motor vehicles are usually highly compact so as to require minimum package space and to enable mounting in specific, in particular confined, spatial conditions while yet, for example, enabling maximally extensive environment perception. However, it is known that due to this compactness thermal influences on components can occur. These effects can result in undesired expansions and position changes between the lens module and an image sensor, which is arranged on the circuit board. This may undesirably influence image capturing.

It is the object of the present invention to provide a camera, a motor vehicle and a method by which for a compact design of the camera thermal management is improved.

This object is solved by a camera and a motor vehicle according to the independent claims.

One aspect of the invention relates to a camera for a motor vehicle. The camera comprises an outer housing. The camera moreover comprises a heat dissipating device for dissipating heat from the camera. The heat dissipating device comprises at least one duct for conveying a liquid or gaseous heat absorption medium, wherein the duct is arranged at the outer housing. By such a design particularly effective heat dissipation is enabled. Such a concrete duct, for example a tube or hose, enables transport of a dynamically moving medium and, likewise, particularly extensive and effective heat dissipation from the camera interior. By such a design it is also achieved that due to the specific arrangement of the duct the interior of the outer housing is not restricted and further heat-dissipating components, specifically in the interior, may be omitted or reduced in size.

It is preferably provided that the duct is non-destructively detachably arranged at an outer side of the outer housing. Thus, for example, it can be replaced or removed for servicing. Moreover, due to such a design the camera can be separated from the duct and serviced or replaced as a separate module.

It is preferably provided that the duct is arranged on an outer side of the outer housing such that in relation to a direction of rotation around a longitudinal axis of the camera it encircles the outer housing at least once at least partially. Thus, a plurality of outer sides of the preferably angular outer housing are equipped with the duct such that highly extensive heat absorption by the duct and by the heat absorption medium conveyed therein is achieved. Thus, heat transfer to the duct is not restricted locally or effected only on one side. Thus, again, quick and extensive heat transfer to the heat absorption medium is achieved.

Due to the flowing and thus, as it were, the continuous replacement of the heat absorption medium in the duct such that the area of the outer housing is always in particular provided with a heat absorption medium capable of absorbing waste heat, particularly extensive and quick heat dissipation from the interior of the outer housing is achieved.

It is in particular provided that the duct only partially encircles the outer housing. Thus, in the present advantageous embodiment it is not envisaged that the duct at least once completely encircles the outer housing. This can in particular be advantageous with regard to the mounting of the duct on a plurality of outer walls of the outer housing. In this context, mounting of the duct can in particular be dispensed with on an outer wall on which mounting would be difficult due to the structural design or form complexity of the outer housing.

It is in particular provided that, viewed in the direction of the longitudinal axis of the camera, the duct extends on the outer housing in meander form. In particular, the duct is arranged and mounted on only three of four outer walls of the outer housing. Thus, specifically due to the meander-like design, a plurality of duct sections and thus a plurality of duct sections of the meander form are arranged on a respective outer wall so that more needs-oriented heat absorption is enabled.

It is preferably provided that on the outer side of at least one housing wall the outer housing comprises a receiving channel for the duct such that the duct is arranged at least partially sunk therein. Thus, highly precise and protected positioning of the duct is enabled. Thus, heat transfer from the camera interior to the duct is again improved. Moreover, by such a design the overall external dimensions of the camera are not or only insignificantly increased. The compactness of the camera is thus not diminished.

It is preferably provided that the receiving channel comprises retaining elements which prevent the duct in the receiving channel from slipping out. In particular, the retaining elements are provided at the radial channel opening such that the duct can be clipped or snapped, as it were, into the receiving channel.

It is preferably provided that a channel bottom of the receiving channel opposite the radial opening of the receiving channel, which thus faces the interior of the camera delimited by the outer housing, is at least sectionally formed with at least one opening towards the interior such that heat from the interior can directly exit via the opening. Thus, in the area of the receiving channel, specifically in the channel bottom, the outer housing comprises gaps, particularly in the form of slots, such that presently the outer housing is locally open. Thus, particularly extensive heat dissipation from the interior of the outer housing is enabled. Moreover, due to installation of the duct specifically in said area, particularly efficient heat transfer to the duct and the heat absorption medium flowing therein is enabled.

Preferably, viewed perpendicularly to its longitudinal axis, the receiving channel comprises a width such that the duct is arranged in the receiving channel with clearance in the direction of the width. Specifically in operative connection with the above-mentioned advantageous embodiment in which the channel bottom is formed to be at least partially open towards the interior, an embodiment is advantageously achieved in which, in other words, the duct does not completely cover such an opening in the channel bottom, so that, on the one hand, the heat which is dissipated via the opening in the channel bottom from the interior of the outer housing into the receiving channel is transferred both to the duct and the heat absorption medium flowing therein, while, on the other hand, it may also flow straight past the duct and exit the outer housing via the radial opening of the receiving channel. Thus, very locally, multifunctional and diverse heat dissipation from the interior of the outer housing is provided.

It is preferably provided that the duct is coupled with a medium dispensing unit external to the camera so that the liquid heat absorption medium from the medium dispensing unit is conveyed via the duct to the camera. This constitutes a further highly advantageous embodiment, since in the present context a medium dispensing unit which is already available in the motor vehicle and which, through the provision of the medium, already in itself comprises a primary function, can further be utilised such that the medium can additionally be used for cooling the camera or dissipating heat from the camera. In this context, it is not required to install an additional unit which is only intended to provide the heat absorption medium and to convey it through the duct. Thus, the already available medium dispensing unit can be used multifunctionally.

It is preferably provided that at two opposite housing walls of the outer housing respective receiving channels are formed, in which the duct is installed. It can preferably be provided that at least one of these receiving channels, in particular all receiving channels, comprise gaps, in particular in the area of the channel bottom, which constitute openings towards the interior of the outer housing.

A further aspect of the invention relates to a device for a camera, wherein the device comprises a camera according to the above-described aspect or an advantageous embodiment thereof. Moreover, the device comprises a medium dispensing unit which is separate from the camera and which is connected with the camera so as to enable transmission of a medium. The medium dispensing unit is primarily configured to clean a device for the motor vehicle separate therefrom, specifically by means of the medium. Further, in addition to its cleaning function for the device for the motor vehicle, the medium is used multifunctionally in that it is also used as a heat absorption medium for dissipating heat from the camera. Specifically, the medium can be conveyed from the medium dispensing unit to the camera via the duct and also, via said duct, back from the camera to the medium dispensing unit.

The medium dispensing unit can, for example, be a windscreen washer or a headlight washer or a washing system for cleaning a lens of the camera.

A further aspect of the invention relates to a motor vehicle with a camera according to the above-mentioned aspect or an advantageous embodiment thereof and/or with a device according to the above-mentioned aspect.

Further features of the invention are apparent from the claims, the figures and the description of figures. The features and feature combinations mentioned above in the description as well as the features and feature combinations mentioned below in the description of figures and/or shown in the figures alone are usable not only in the respectively specified combination but also in other combinations, without departing from the scope of the invention. Thus, implementations are also to be considered as encompassed and disclosed by the invention, which are not explicitly shown in the figures and explained, but arise from and can be generated by separated feature combinations from the explained implementations. Implementations and feature combinations are also to be considered as disclosed, which thus do not comprise all of the features of an originally formulated independent claim. Moreover, implementations and feature combinations are to be considered as disclosed, in particular by the implementations set out above, which extend beyond or deviate from the feature combinations set out in the back-references of the claims.

Figure 2:
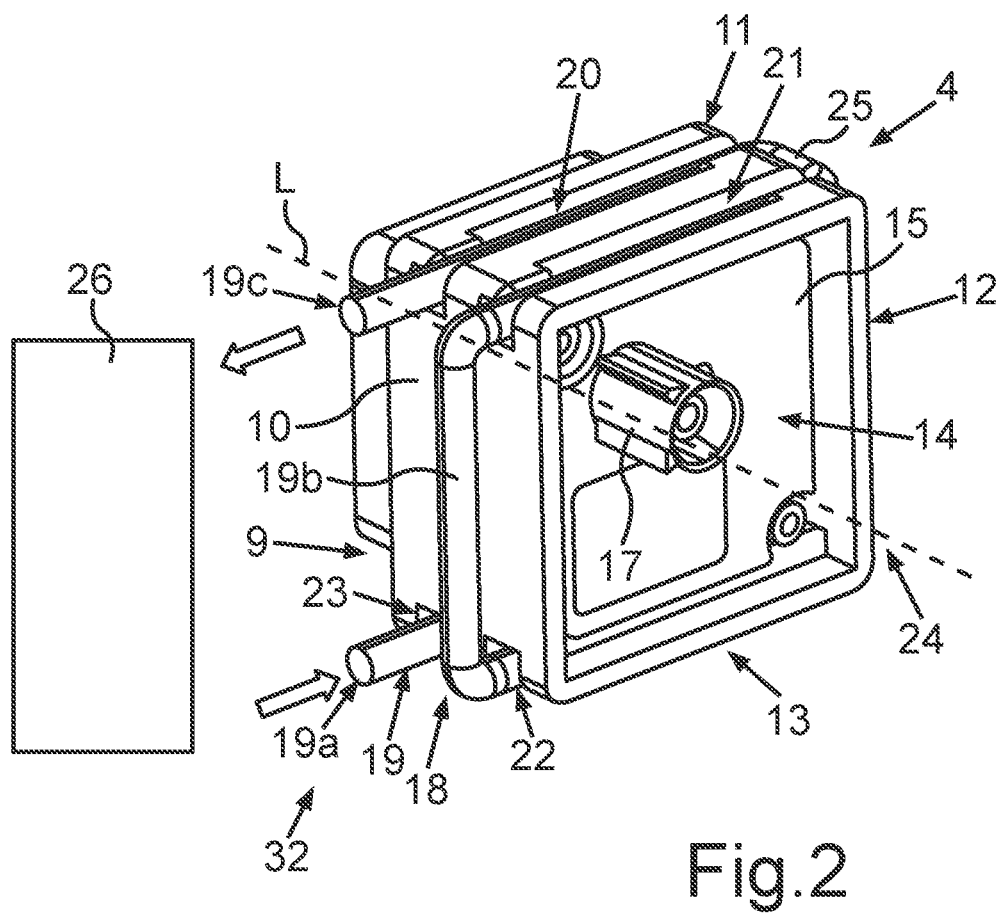
Figure 3:
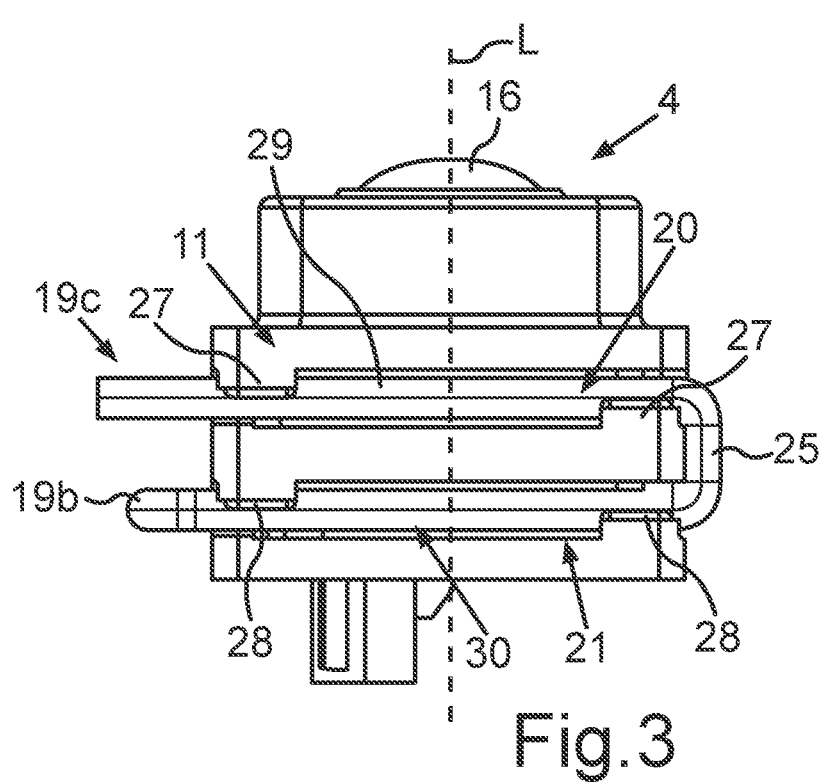
Figure 4:
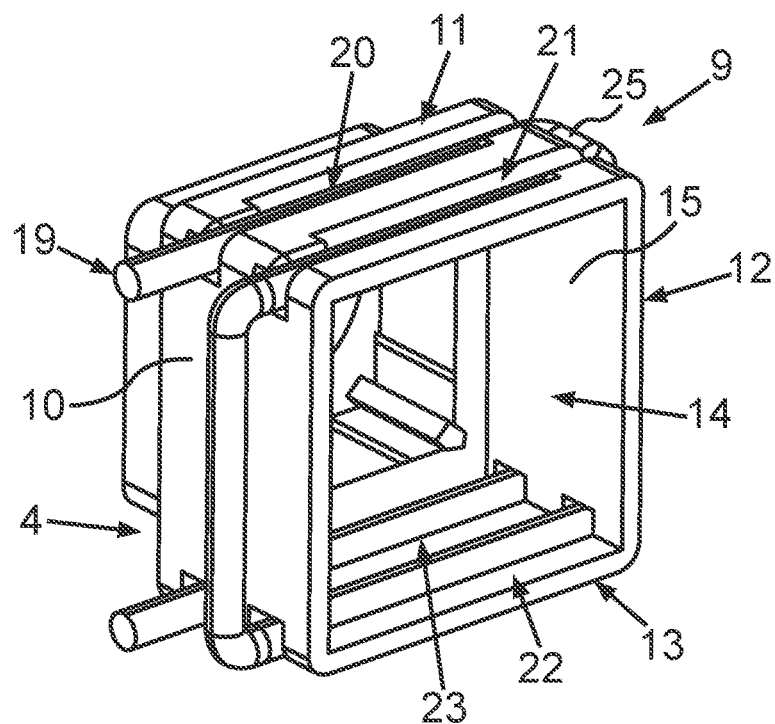
Figure 5:
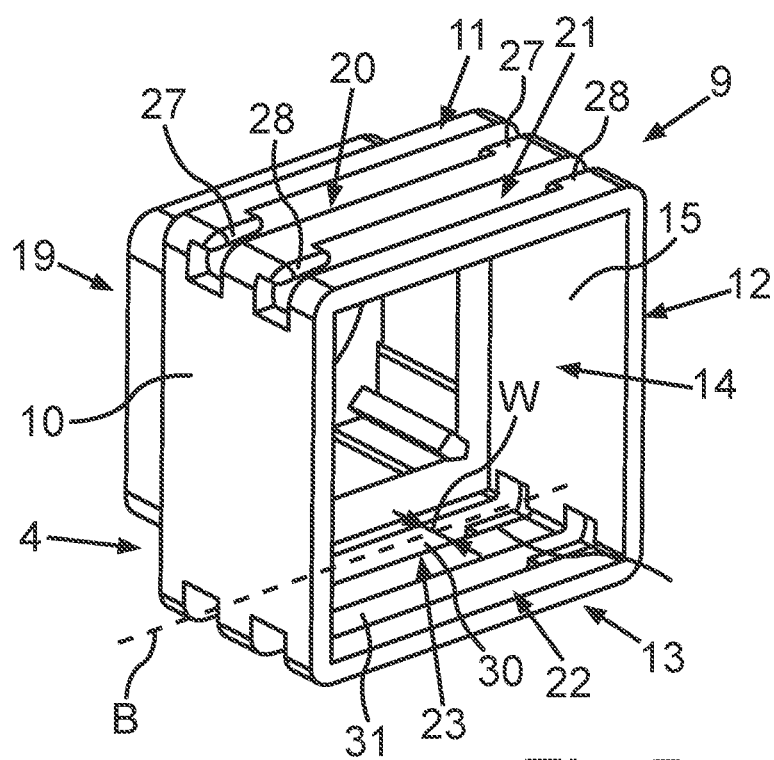

Embodiments of the invention are explained in the following in more detail on the basis of schematic drawings. These show in:

FIG. 1 a schematic top view of an embodiment of a motor vehicle according to the invention with an embodiment of a camera according to the invention;

FIG. 2 a perspective view of an embodiment of a camera with a duct mounted on the outer housing;

FIG. 3 a side view of the camera according to FIG. 2;

FIG. 4 the representation of FIG. 2, in which, however, only the outer housing and the duct are shown; and FIG. 5 the representation of the outer housing according to FIG. 4.

In the figures, identical or functionally identical elements are equipped with the same reference signs.

FIG. 1 shows a top view of a motor vehicle 1 according to an embodiment of the present invention. The motor vehicle 1 is presently a passenger car. The motor vehicle 1 comprises an electronic vehicle guidance system, in particular a driver assistance system 2. The driver assistance system 2 comprises a control device 3 which can, for example, be an electronic control unit of the motor vehicle 1. Moreover, the driver assistance system 2 comprises at least one camera 4. In the present embodiment, the driver assistance system 2 in particular comprises four cameras 4 which are arranged distributed on the motor vehicle 1. Presently, one of the cameras 4 is arranged in a rear area 5, one of the cameras 4 is arranged in a front area 7 of the motor vehicle 1 and the remaining two cameras 4 are arranged in a respective side area 6, in particular in an area of the side mirrors. The number and arrangement of the cameras 4 of the driver assistance system 2 is presently meant to be merely exemplary.

Additionally or alternatively, at least one camera can be provided which is formed and arranged to capture an interior or passenger compartment of the motor vehicle 1. In particular, the cameras 4 are each mounted on an individual motor vehicle component. A motor vehicle component can, for example, be a bumper or an exterior mirror or a side panel. The motor vehicle component can further, for example, be a roof liner or an interior trim or a cover for a steering wheel centre or an interior mirror. The above motor vehicle components are intended to be merely exemplary. Other motor vehicle components may also be envisaged.

The above merely serves to illustrate that the motor vehicle components may vary with regard to position and material design.

By the cameras 4 an environmental region 8 of the motor vehicle 1 can be captured. Preferably, the cameras 4 are of identical design. In particular, the cameras 4 can provide an image sequence or video data which describe the environmental region 8. The video data can be transmitted from the cameras 4 to the control device 3. By the control device 3 a display device of the motor vehicle 1, which is presently not shown, can be controlled such that the video data of the cameras 4 can be displayed to the driver. The driver assistance system 2 thus serves to assist the driver of the motor vehicle 1 in driving the motor vehicle 1. The driver assistance system 2 can, for example, be a so-called electronic rear-view mirror or a park assist system or the like. It can also be formed in an interior for detecting a person, in particular a driver.

FIG. 2 shows a perspective view of an embodiment of a camera 4. The camera 4 comprises an outer housing 9 which is angular, in particular quadrangular, with respect to a direction of rotation around a longitudinal axis L. The outer housing 9 may be of one-piece, preferably of multi-piece, design.

In the illustrated example, the outer housing 9 comprises four housing walls 10, 11, 12 and 13. By the outer housing 9 an inner space or interior 14 of the camera 4 is delimited. In the interior 14, e.g. at least one circuit board 15 as well as a lens module 16 (FIG. 3) is mounted. Further components such as connections and the like can also be arranged therein. In particular, a cable feed 17 leads into the interior 14 and may protrude from the outer housing 9.

Moreover, the camera 4 comprises a heat dissipation device 18, which is separate from the outer housing 9. The heat dissipation device 18 presently comprises a duct 19. There may be present at least one duct 19, but also, for example, a plurality of ducts. The duct 19 may be a hose or a tube and it may be inherently rigid or flexible. The duct 19 is configured to convey a gaseous or liquid medium, which can in particular be a heat dissipation medium or a heat absorption medium. In this context, e.g. water or an aqueous medium may be envisaged.

The duct 19 is arranged at the outer housing 9 or at least partially mounted in walls of the outer housing 19.

As can be seen here, the duct 19 is arranged on side walls of the outer housing 9 such that, in a direction of rotation around the longitudinal axis L of the camera 4, it is guided at least partially, in the present embodiment only partially, around the outer housing 9.

Presently, viewed in the direction of the longitudinal axis L of the camera 4, the duct 19 is arranged in meander form.

In the presently illustrated embodiment, preferably on two housing walls, here housing wall 11 and 13, there is respectively provided at least one receiving channel, here, preferably, two receiving channels 20, 21 and 22, 23, respectively. Thus, the duct 19 is mounted on the housing walls 11 and 13 in these receiving channels 20 to 23, in particular completely sunk therein. The receiving channels 20, 21 and 22, 23 are presently preferably arranged in parallel and extend across the entire dimensions of the housing walls 11 and 13 in this width. The duct 19 is installed with a beginning of the duct 19a in the receiving channel 23, bent at the opposite end in the area of the housing wall 12 and guided back via the receiving channel 22, whence via a duct section 19b it is led to the receiving channel 21 and installed therein accordingly. The duct 19 is then led out of the receiving channel 21 via an outlet and thence, via a further bend 25, directed into the receiving channel 20, wherein at the exit of the receiving channel 20 an end 19c of the duct 19 leads away from the outer housing 9, in particular to a further module, shown symbolically in FIG. 2, which is in particular a medium dispensing unit 26 of the motor vehicle 1. The medium dispensing unit 26, in FIG. 2 merely symbolically represented as a block element, may be a washing unit and/or a cleaning unit of the motor vehicle 1. Thus, also, a device 32 is formed.

FIG. 3 shows the housing wall 11 of the outer housing 9 of the camera 4. As can be seen, the receiving channels 20, 21 preferably comprise retaining elements 27, 28 which are in particular formed at radial channel entries 29 and 30 and which reduce or narrow the cross section of a channel entry 29, 30. Thus, the duct 19 is prevented from radially slipping out of the receiving channels 20 and 21. Preferably, the retaining elements 27 and 28 are formed in pairs at the respective receiving channel 20, 21, in particular at opposite ends of the respective receiving channel 20, 21. The above by analogy also applies with respect to the receiving channels 22 and 23.

In FIG. 4 only the duct 19 and the outer housing 9 of the camera 4 are shown. Thus, the interior 14 of the camera is visible. It can be seen that the receiving channels, presently in particular all receiving channels 20 to 23, are specifically formed with completely open channel bottoms. This means that the receiving channels 20 to 23 are open towards the interior 14. Thus, the sections of the duct 19 which are arranged in the receiving channels 20 to 23 are freely exposed to the interior 14.

FIG. 5 shows the perspective representation of the outer housing 9 according to FIG. 4, wherein presently the duct 19 is not arranged at the outer housing 9. The design of the receiving channels 20 to 23 is thus more clearly discernible. It can in particular be seen that a width w of a receiving channel, presently of the receiving channel 23, in particular of all receiving channels 20 to 23, is so large that a duct 19 is arranged in one of receiving channels 20 to 23 with clearance in the direction of the width w. Preferably, in the direction of the width w, an opening 30, 31 in a channel bottom of one of receiving channel 20 to 23 is so large, in particular dimensioned with said width w, that in the mounted state of the duct 19, the duct 19 does not completely cover the opening in the channel bottom so that via the opening 30, 31 with the width w heat from the interior 14 can pass by the sides of the duct 19 and flow outside. The width w is measured perpendicularly to a longitudinal axis B of a channel and further measured in the plane in which the housing wall, presently the housing wall 13, extends.

Specifically if the receiving channels 20 to 23 comprise the above-mentioned openings 30, 31 or breaches in their channel bottoms which face the interior 14, and specifically if the channel bottoms are preferably completely open, it is advantageous if a duct section 19b is mounted completely outside the outer housing 9, in particularly such that it directly abuts on an outer side of a housing wall, presently the housing wall 10. Thus, stability of the outer housing 9 is maintained. Additionally or alternatively, the above also, similarly, applies with respect to the bends 24 and 25 of the duct 19.

The invention claimed is:

1. A camera for a motor vehicle, comprising:
   an outer housing; and
   a heat dissipating device for dissipating heat from the camera,
   wherein the heat dissipating device comprises a duct for conveying a liquid or gaseous heat absorption medium, wherein the duct is closed and arranged on at least two opposite housing walls of the outer housing, wherein the duct covers a portion of openings on the housing walls, wherein on the outer side of at least one housing wall the outer housing comprises a receiving channel for the duct such that the duct is arranged at least partially sunk in the receiving channel, and wherein the duct is arranged and mounted completely outside the outer housing on a housing wall to directly abut on an outer side of the housing wall to maintain stability of the outer housing.

2. The camera according to claim 1, wherein the duct is arranged on an outer side of the outer housing such that in relation to a direction of rotation around a longitudinal axis of the camera it encircles the outer housing at least once at least partially.

3. The camera according to claim 2, wherein the duct only partially encircles the outer housing.

4. The camera according to claim 2, wherein the duct is arranged and mounted on only three of four outer walls.

5. The camera according to claim 1, wherein the receiving channel comprises retaining elements by which the duct in the receiving channel is prevented from slipping out.

6. The camera according to claim 1, wherein a channel bottom of the receiving channel which faces an interior of the outer housing is at least sectionally formed with at least one opening towards the interior of the outer housing such that heat from the interior directly exits via the opening.

7. The camera according to claim 1, wherein viewed perpendicularly to its longitudinal axis, the receiving channel is dimensioned with a width such that the duct is arranged in the receiving channel with clearance in a direction of the width.

8. The camera according to claim 1, wherein the duct is coupled with a medium dispensing unit external to the camera so that the liquid medium from the medium dispensing unit is conveyed via the duct to the camera.

9. A device for a motor vehicle, comprising
a camera according to claim 1; and
a medium dispensing unit which is connected with the camera so as to enable transmission of a medium, wherein the medium dispensing unit is configured to clean a device for the motor vehicle by the medium,
wherein the medium is conveyed from the medium dispensing unit to the camera via the duct and also conveyed back from the camera to the medium dispensing unit via the duct.

10. A motor vehicle with a camera according to claim 1; and
a device with a medium dispensing unit which is connected with the camera to enable transmission of a medium, wherein the medium dispensing unit is configured to clean a device for the motor vehicle by the medium,
wherein the medium is conveyed from the medium dispensing unit to the camera via the duct and also conveyed back from the camera to the medium dispensing unit via the duct.

* * * * *